（12） United States Patent
Kim et al.

(10) Patent No.: US 12,514,102 B2
(45) Date of Patent: Dec. 30, 2025

(54) APPARATUS FOR MANUFACTURING DISPLAY DEVICE AND METHOD FOR MANUFACTURING DISPLAY DEVICE USING THE SAME

(71) Applicant: Samsung Display Co., LTD., Yongin-si (KR)

(72) Inventors: Young Su Kim, Gunpo-si (KR); Kyung Rok Ko, Suwon-si (KR); Hyo Jin Kim, Hwaseong-si (KR); Jae Suk Yoo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 629 days.

(21) Appl. No.: 17/955,690

(22) Filed: Sep. 29, 2022

(65) Prior Publication Data

US 2023/0276686 A1 Aug. 31, 2023

(30) Foreign Application Priority Data

Feb. 28, 2022 (KR) .................. 10-2022-0026110

(51) Int. Cl.
*H01L 51/56* (2006.01)
*H10K 71/00* (2023.01)
*H10K 77/10* (2023.01)

(52) U.S. Cl.
CPC ........... *H10K 71/00* (2023.02); *H10K 77/111* (2023.02)

(58) Field of Classification Search
CPC . B29C 53/04; B29C 53/38–46; B29C 53/845; B29C 65/7805–7817;

(Continued)

(56) References Cited

U.S. PATENT DOCUMENTS

2021/0384479 A1 12/2021 Lee et al.

FOREIGN PATENT DOCUMENTS

CN 113763812 12/2021
KR 1020170133200 12/2017
(Continued)

OTHER PUBLICATIONS

Machine translation, Kim, Korean Pat. Pub. No. KR20220016385A, translation date: May 6, 2025, Espacenet, all pages. (Year: 2025).*

*Primary Examiner* — Victoria K. Hall
(74) *Attorney, Agent, or Firm* — CANTOR COLBURN LLP

(57) ABSTRACT

An apparatus for manufacturing a display device includes a sheet portion where a bending line extending along a first direction is defined to overlap a portion of the sheet portion; a panel attachment member disposed on the sheet portion; a magnet portion disposed on the sheet portion and including a first magnet portion positioned on a first side in a second direction intersecting the first direction and a second magnet portion positioned on a second side in the second direction with respect to the bending line; a pad spaced apart from the panel attachment member with the sheet portion interposed therebetween and positioned between the first magnet portion and the second magnet portion; and a core disposed in the pad, where the first magnet portion and the second magnet portion are symmetrical to each other with respect to the bending line.

18 Claims, 16 Drawing Sheets

(58) Field of Classification Search
CPC .............. B29C 65/785; B29C 65/7852; B32B 37/00–30; B32B 2457/20–208
See application file for complete search history.

(56) References Cited

FOREIGN PATENT DOCUMENTS

| KR | 1020190124358 | | | 11/2019 | | |
|---|---|---|---|---|---|---|
| KR | 102236234 | | | 4/2021 | | |
| KR | 1020220016385 | A | * | 2/2022 | ........... | G06F 1/1616 |

\* cited by examiner

APPARATUS FOR MANUFACTURING DISPLAY DEVICE AND METHOD FOR MANUFACTURING DISPLAY DEVICE USING THE SAME

This application claims priority to Korean Patent Application No. 10-2022-0026110, filed on Feb. 28, 2022, and all the benefits accruing therefrom under 35 U.S.C. 119, the content of which in its entirety is herein incorporated by reference.

BACKGROUND

1. Field

The disclosure relates to an apparatus for manufacturing a display device, and a method for manufacturing a display device using the apparatus.

2. Description of the Related Art

Electronic devices that provide images to users, such as smart phones, tablet personal computers (PCs), digital cameras, notebook computers, navigation systems, and smart televisions, include display devices for displaying images. The display devices may include a display panel that generates and displays an image and various input devices.

Among display devices, an organic light emitting diode display displays an image using an organic light emitting element that generates light by recombination of electrons and holes. The organic light emitting diode display has a fast response speed, high luminance, and a large viewing angle, and may be driven with low power consumption.

SUMMARY

Embodiments of the disclosure provide an apparatus for manufacturing a display device capable of implementing reliable lamination between a curved display panel and a curved window.

Embodiments of the disclosure also provide a method for manufacturing a display device capable of implementing reliable lamination between a curved display panel and a curved window using the apparatus for manufacturing the display device.

An embodiment of an apparatus for manufacturing a display device includes a sheet portion where a bending line extending along a first direction is defined to overlap a portion of the sheet portion; a panel attachment member disposed on the sheet portion; a magnet portion disposed on the sheet portion and including a first magnet portion positioned on a first side in a second direction intersecting the first direction and a second magnet portion positioned on a second side in the second direction with respect to the bending line; a pad spaced apart from the panel attachment member with the sheet portion interposed therebetween and positioned between the first magnet portion and the second magnet portion; and a core disposed in the pad, where the first magnet portion and the second magnet portion are symmetrical to each other with respect to the bending line.

An embodiment of a method for manufacturing a display device includes disposing a target panel and a panel window coupling member on a panel window coupling apparatus, where the panel window coupling apparatus includes a sheet portion where a bending line extending along a first direction is defined to overlap a portion of the sheet portion, a panel attachment member disposed on the sheet portion, a magnet portion disposed on the sheet portion member and including a first magnet portion positioned on a first side in a second direction intersecting the first direction and a second magnet portion positioned on a second side in the second direction based on the bending line, a pad spaced apart from the panel attachment member with the sheet portion interposed therebetween and positioned between the first magnet portion and the second magnet portion, and a core disposed in the pad; folding the sheet portion and the panel attachment member based on the bending line; and moving the panel window coupling apparatus to bring a peak of the target panel into contact with a peak of a window.

According to embodiments of the apparatus for manufacturing a display device and the method for manufacturing a display device using the apparatus, the lamination between the curved display panel and the curved window may be improved.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
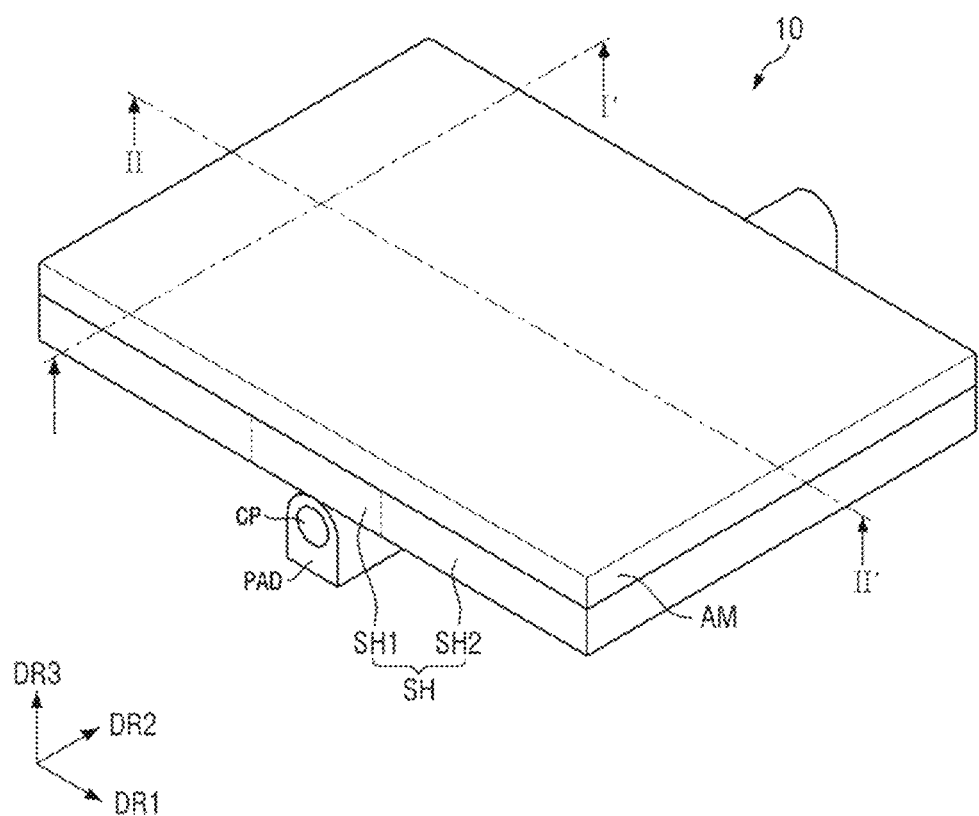
FIG. 1 is a perspective view of an apparatus for manufacturing a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the accompanying drawings.

Figure 2:
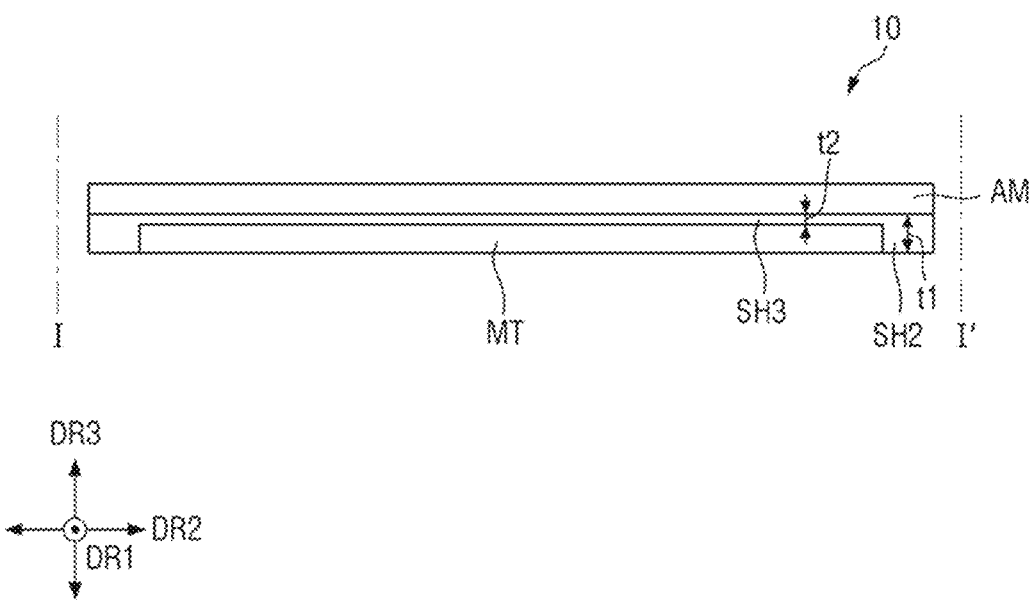
FIG. 2 is a cross-sectional view taken along line I-I' of FIG. 1.
Figure 3:
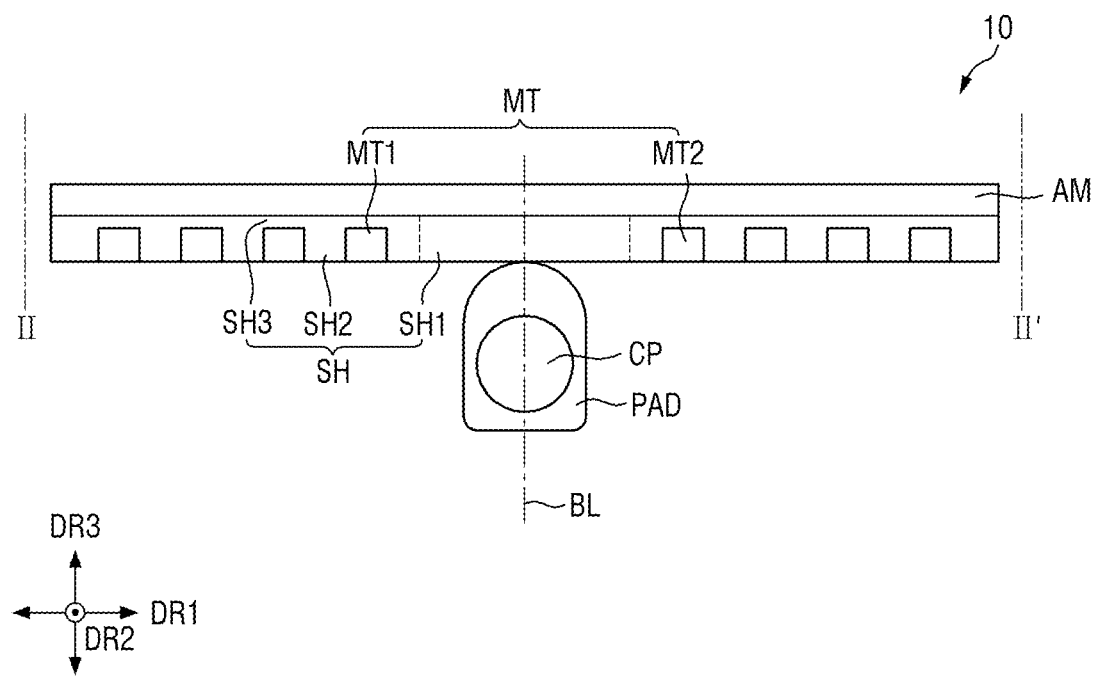
FIG. 3 is a cross-sectional view taken along line II-II' of FIG. 1.

FIG. 1 is a perspective view of an apparatus for manufacturing a display device according to an embodiment. FIG. 2 is a cross-sectional view taken along line I-I' of FIG. 1. FIG. 3 is a cross-sectional view taken along line II-II' of FIG. 1.

In embodiments, a first direction DR1 and a second direction DR2 are directions that intersect each other in different directions, and indicate, for example, directions that vertically intersect each other in a plan view. In the accompanying drawings, the first direction DR1 indicates a horizontal direction (width direction) of an apparatus 10 for manufacturing a display device, and the second direction DR2 may indicate a vertical direction (length direction) of the apparatus 10 for manufacturing a display device. In embodiments described herein, one side in the first direction DR1 (or a first side) may refer to a right direction in a plan view and the other side in the first direction DR1 (or a second side opposite to the first side) may refer to a left direction in a plan view, and one side in the second direction DR2 may refer to an upper direction in a plan view and the other side in the second direction DR2 may refer to a lower direction in a plan view. Here, a plan view may mean a top plan view or a plan view when viewed in a third direction DR3, which is perpendicular to the first direction DR1 and the second direction DR2. However, it should be understood that the directions mentioned in the embodiments refer to relative directions, and the embodiments are not limited to the mentioned directions.

Referring to FIGS. 1 to 3, the apparatus 10 for manufacturing a display device is a manufacturing apparatus for laminating (or combining) a display panel (or target panel) and a window of the display device. In an embodiment, for example, the apparatus 10 for manufacturing a display device may be a manufacturing apparatus for linearly deforming a display panel of the display device to form a curved display panel, and laminating (or combining) the linearly deformed curved display panel and a curved window to each other. The display device may refer to any electronic device that provides a display screen.

In an embodiment, for example, the display device may include televisions, laptop computers, monitors, billboards, and the Internet of Things, as well as portable electronic devices such as mobile phones, smart phones, tablet personal computers (PCs), electronic watches, smart watches, watch phones, mobile communication terminals, electronic notebooks, e-books, portable multimedia player (PMP), navigation devices, game machines, and digital cameras that provide the display screen.

The apparatus 10 for manufacturing a display device according to an embodiment may include a sheet portion SH, a panel attachment member AM disposed on an upper portion of the sheet portion SH, a pad PAD disposed on a lower portion of the sheet portion SH, and a core CP disposed in the pad PAD. The sheet portion SH may be disposed between the pad PAD and the panel attachment member AM. In such an embodiment, the pad PAD may be spaced apart from the panel attachment member AM with the sheet portion SH interposed therebetween.

A planar shape of the sheet portion SH may have a rectangular shape, for example. Here, a planar shape may be shape on a plane defined by the first direction DR1 and the second direction DR2 or when viewed in the third direction DR3. The planar shape of the sheet portion SH is not limited thereto, and may have a square, circular, oval, or other polygonal shape. Hereinafter, embodiments where the planar shape of the sheet portion SH is the rectangular shape will be mainly described.

The sheet portion SH may include long sides extending along the first direction DR1 and short sides extending along the second direction DR2. In an embodiment, as shown in FIG. 3, a bending line BL extending along the third direction DR3 may be defined in the sheet portion SH. The sheet portion SH may be bent or folded based on the bending line BL. The bending line BL may be positioned at a point dividing the long side of the sheet portion SH extending in the first direction DR1 into two equal portions. Accordingly, the sheet portion SH may be symmetrical with respect to the bending line BL.

The sheet portion SH may include a first sheet portion SH1 disposed to overlap the bending line BL, and a second sheet portion SH2 and a third sheet portion (see SH3 in FIG. 2) positioned on one side and the other side of the first sheet portion SH1 in the first direction DR1. The first sheet portion SH1 may be formed to cross a long side on one side of the sheet portion SH in the second direction DR2 and a long side on the other side thereof in the second direction DR2.

The sheet portion SH may include silicon. However, the sheet portion SH is not limited thereto, and may include a sheet material used for laminating a display panel and a window widely known in the art.

The pad PAD may be disposed to overlap the first sheet portion SH1 of the sheet portion SH in a thickness direction or the third direction DR3. The pad PAD may extend in the second direction DR2. The pad PAD may be disposed to overlap the bending line BL of the sheet portion SH. An end portion on one side of the pad PAD in the second direction DR2 and an end portion on the other side thereof in the second direction DR2 are positioned outside the long side on one side of sheet portion SH in the second direction DR2 and the long side on the other side thereof in the second direction DR2, respectively, but are not limited thereto.

The pad PAD may be disposed on the first sheet portion SH1.

In an embodiment, the pad PAD may include a material having a higher strength than the sheet portion SH, but the material of the pad PAD is not particularly limited.

The core CP may be disposed in the pad PAD. A hardness of the core CP may be greater than that of the pad PAD. The core CP may extend in the second direction DR2. The core CP may be disposed to overlap the bending line BL of the sheet portion SH. An end portion on one side of the core CP in the second direction DR2 and an end portion on the other side thereof in the second direction DR2 are positioned outside the long side on one side of sheet portion SH in the second direction DR2 and the long side on the other side thereof in the second direction DR2, respectively, but are not limited thereto.

The panel attachment member AM may be disposed on an upper portion of the sheet portion SH. A planar shape of the panel attachment member AM may be substantially the same as the planar shape of the sheet portion SH. In an embodiment, for example, the panel attachment member AM may include long sides extending along the first direction DR1 and short sides extending along the second direction DR2. The panel attachment member AM may be bent or folded based on the bending line BL. The bending line BL may be positioned at a point dividing the long side of the panel attachment member AM extending in the first direction DR1 into two equal portions. Accordingly, the panel attachment member AM may be symmetrical with respect to the bending line BL. A display panel, which will be described later, may be attached to the panel attachment member AM.

In an embodiment, the panel attachment member AM may include an electrostatic chuck. In such an embodiment, when a current is applied to the panel attachment member AM, static electricity of a reference value or more is formed on a surface of the panel attachment member AM, so that the display panel is attached to the panel attachment member AM through an electrostatic attraction of the static electricity. In such an embodiment, when no current is applied to the panel attachment member AM, the static electricity of the reference value or more is not formed on the surface of the panel attachment member AM, so that the display panel may be separated from the panel attachment member AM.

In some embodiments, the panel attachment member AM may also include an adhesive such as Velcro (or hook and loop).

Referring to FIG. 2, the sheet portion SH may further include a third sheet portion SH3. A magnet portion MT may be disposed on the third sheet portion SH3. A surface (or lower surface) of the third sheet portion SH3 may be positioned closer to an inner side (a side facing the panel attachment member AM) compared to a surface (or lower surface) of the second sheet portion SH2. In such an embodiment, the third sheet portion SH3 may be an inwardly recessed portion.

The second sheet portion SH2 may have a first thickness t1, and the third sheet portion SH3 may have a second thickness t2 smaller than the first thickness t1.

The third sheet portion SH3 does not completely cross the long side on one side of the sheet portion SH in the second direction DR2 and the long side on the other side thereof in the second direction DR2, and one end and the other end of the third sheet portion SH3 may be positioned between the long side on one side of the sheet portion SH in the second direction DR2 and the long side on the other side thereof in the second direction DR2. However, the third sheet portion SH3 is not limited thereto, and may also completely cross the long side on one side of the sheet portion SH in the second direction DR2 and the long side on the other side thereof in the second direction DR2.

The magnet portion MT may be disposed on the third sheet portion SH3 or in a recess defined in the sheet portion SH. The magnet portion MT may be disposed to overlap the third sheet portion SH3 in the thickness direction, and may not be disposed to overlap the adjacent second sheet portion SH2 in the thickness direction.

The thickness of the first sheet portion SH1 may be the same as the thickness t1 of the second sheet portion SH2.

The magnet portion MT may include a first magnet portion MT1 positioned on the other side of the bending line BL in the first direction DR1, and a second magnet portion MT2 positioned on one side thereof in the first direction DR1 with respect to the bending line BL. The first magnet portion MT1 and the second magnet portion MT2 may be disposed on the third sheet portion SH3, respectively.

The first magnet portion MT1 and the second magnet portion MT2 may be symmetrically disposed with respect to the bending line BL.

The number of the first magnet portions MT1 and the second magnet portions MT2 may be plural, respectively. In FIG. 3, the number of the first magnet portions MT1 and the second magnet portions MT2 is illustrated as four, respectively, but is not limited thereto, and alternatively, the number of the first magnet portions MT1 and the second magnet portions MT2 may be 1 to 3, or 5 or more, respectively.

The first magnet portion MT1 and the second magnet portion MT2 may have different polarities from each other. In an embodiment, for example, the first magnet portion MT1 may have an N pole, and the second magnet portion MT2 may have an S pole. In an alternative embodiment, for example, the first magnet portion MT1 may have an S pole, and the second magnet portion MT2 may have an N pole.

Figure 4:
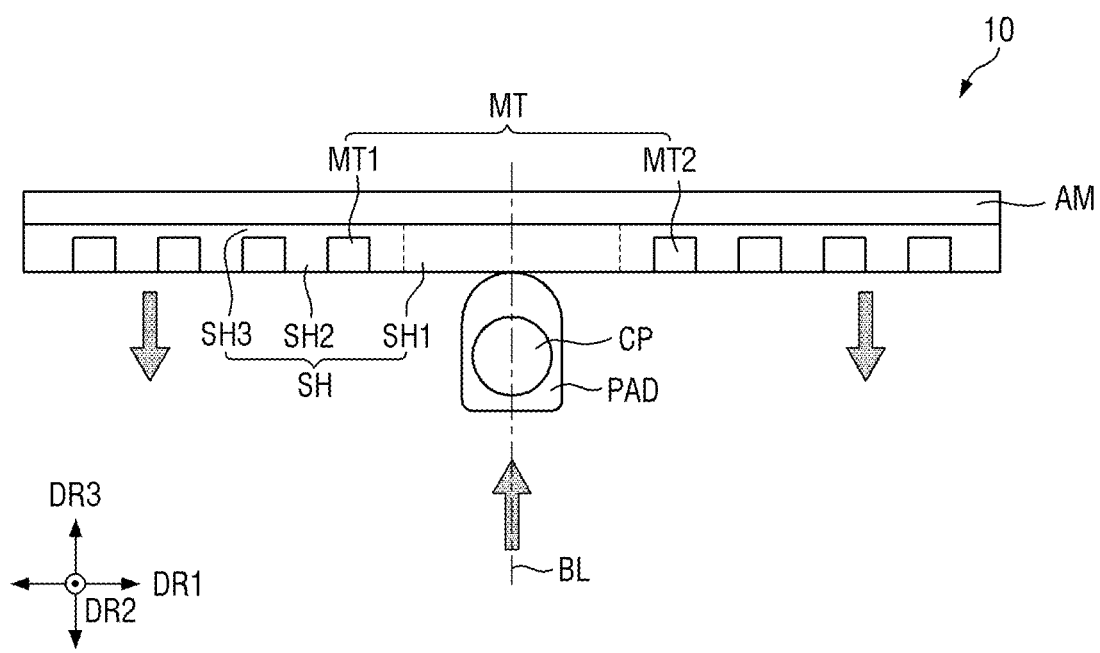
FIG. 4 is a schematic diagram illustrating that the apparatus for manufacturing a display device in a process of folding according to an embodiment.

FIG. 4 is a schematic diagram illustrating that the apparatus for manufacturing a display device in a process of folding according to an embodiment.

Referring to FIG. 4, an embodiment of the apparatus 10 for manufacturing a display device may be bent or folded based on the bending line BL. In such an embodiment, the apparatus 10 for manufacturing a display device may be bent or folded based on the pad PAD disposed to overlap the bending line BL.

In such an embodiment, for a folding operation, the pad PAD may be raised or moved in an upper direction (upper direction in the third direction DR3 or toward the first sheet portion SH1), and the sheet portion SH and the panel attachment member AM may be lowered or moved in a lower direction in the third direction DR3 based on the pad PAD. In FIG. 4, it is illustrated that for the folding operation, the pad PAD is raised in the upper direction (upper direction in the third direction DR3), and the remaining sheet portion SH and panel attachment member AM except for the sheet portion SH and the panel attachment member AM disposed to overlap the pad PAD are lowered based on the pad PAD, but the disclosure is not limited thereto. For the folding operation, in a state in which only the pad PAD is raised in the upper direction (upper direction in the third direction DR), and the sheet portion SH and the remaining panel attachment members AM except for the sheet portion SH and the panel attachment member AM disposed to overlap the pad PAD are fixed, the apparatus 10 for manufacturing a display device may be folded. In some embodiments, for the folding operation, in the state in which the pad PAD is fixed, the remaining panel attachment members AM except for the sheet portion SH and the panel attachment member AM disposed to overlap the pad PAD may also be lowered.

Figure 5:
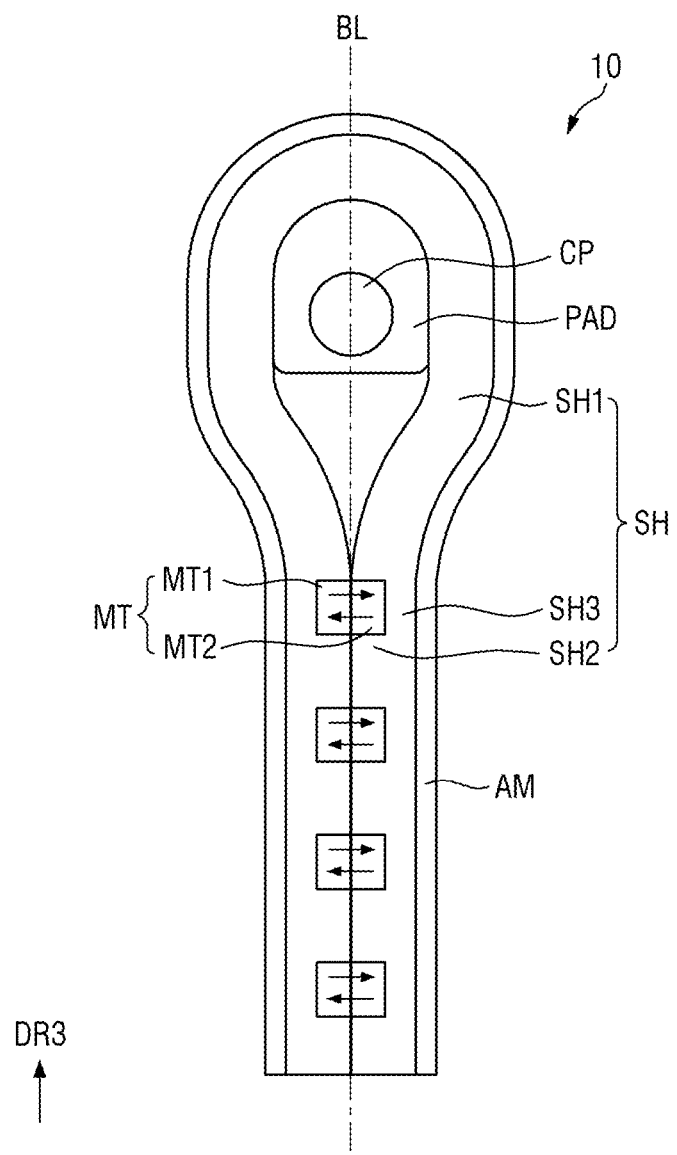
FIG. 5 is a cross-sectional view illustrating the apparatus for manufacturing a display device in a folded state according to an embodiment.

FIG. 5 is a cross-sectional view illustrating the apparatus for manufacturing a display device in a folded state according to an embodiment.

Referring to FIG. 5, in an embodiment, the sheet portion SH and the panel attachment member AM may be folded based on the pad PAD through the operation of the apparatus 10 for manufacturing the display device of FIG. 4.

In such an embodiment, an area of the first sheet portion SH1 and the panel attachment member AM disposed to overlap the first sheet portion SH1 in FIG. 4 may be curved as illustrated in FIG. 5 to form a curved shape, and the second sheet portion SH2 and the third sheet portion SH3 may be flattened to form a flat shape. An area of the panel attachment member AM disposed to overlap the second sheet portion SH2 and the third sheet portion SH3 in FIG. 4 may also be flattened to form a flat shape.

The second sheet portion SH2 having a flat shape positioned on the other side in the first direction DR1 based on the bending line BL illustrated in FIG. 4 may be in direct contact with the second sheet portion SH2 having a flat shape positioned on one side in the first direction DR1.

In addition, the first magnet portion MT1 on the third sheet portion SH3 having a flat shape positioned on the other side in the first direction DR1 based on the bending line BL illustrated in FIG. 4 may be coupled to the second magnet portion MT2 on the third sheet portion SH3 having a flat shape positioned on one side in the first direction DR1 through a magnetic force.

Hereinafter, a method for manufacturing a display device using the apparatus for manufacturing the display device according to an embodiment will be described. In the following embodiments, the same or like components as those described above are denoted by the same or like reference numerals, and any repetitive detailed descriptions thereof will be omitted or simplified.

FIGS. 6 to 14 are cross-sectional views illustrating the processes of a method for manufacturing a display device according to an embodiment.

Figure 6:
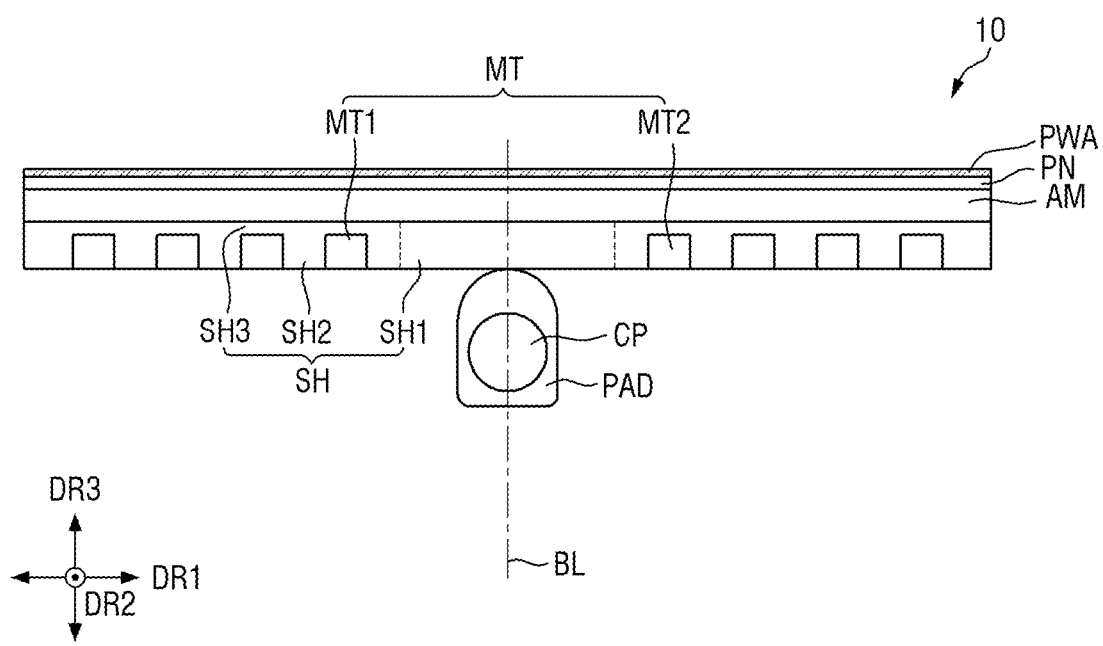
FIGS. 6 to 14 are cross-sectional views illustrating the processes of a method for manufacturing a display device according to an embodiment.

First, referring to FIG. 6, a target panel PN and a panel window coupling member PWA are disposed on a panel window coupling apparatus (10 in FIG. 1) including a sheet portion SH in which a bending line BL extending along a third direction DR3 is defined, a panel attachment member AM disposed on the sheet portion SH, a magnet portion MT disposed on the sheet portion SH and including a first magnet portion MT1 positioned on the other side in a second direction DR2 and a second magnet portion MT2 positioned on one side in the second direction DR2 based on the bending line BL, a pad PAD spaced apart from the panel attachment member AM with the sheet portion SH interposed therebetween and positioned between the first magnet portion MT1 and the second magnet portion MT2, and a core CP disposed in the pad PAD.

The panel window coupling apparatus used in the method for manufacturing the display device according to an embodiment is substantially the same as the apparatus 10 for manufacturing the display device described above with reference to FIGS. 1 to 5. In such an embodiment, the panel window coupling apparatus 10 may include the sheet portion SH, the panel attachment member AM disposed on an upper portion of the sheet portion SH, the pad PAD disposed on a lower portion of the sheet portion SH, and the core CP disposed in the pad PAD. The sheet portion SH may be disposed between the pad PAD and the panel attachment member AM. In such an embodiment, the pad PAD may be spaced apart from the panel attachment member AM with the sheet portion SH interposed therebetween. In such an embodiment, the sheet portion SH, the panel attachment member AM, the pad PAD, and the core CP are the same as those described above, any repetitive detailed description thereof will be omitted.

The target panel PN may be disposed on the sheet portion SH or the panel attachment member AM. The panel window coupling member PWA may be disposed on an upper portion of the target panel PN.

The panel attachment member AM may include an electrostatic chuck. In such an embodiment, when a current is applied to the panel attachment member AM, static electricity of a reference value or more is formed on a surface of the panel attachment member AM, so that the display panel is attached to the panel attachment member AM through an electrostatic attraction of the static electricity. In such an embodiment, when no current is applied to the panel attachment member AM, the static electricity of the reference value or more is not formed on the surface of the panel attachment member AM, so that the display panel may be separated from the panel attachment member AM.

The target panel PN is a panel that displays a screen or image. In an embodiment, the target panel PN may be a light-receiving display panel such as a liquid crystal display (LCD) panel and an electrophoretic display (EPD) panel, or a self-light emitting display panel such as an organic light emitting display (OLED) panel, an inorganic light emitting display (inorganic EL) panel, a quantum dot light emitting display (QDLED) panel, micro light emitting diode (LED) display panel, a nano LED display panel, a plasma display panel (PDP), a field emission display (FED) panel, and a cathode ray tube (CRT) display panel. Hereinafter, embodiments where the target panel PN is the organic light emitting display panel will be described, and the organic light emitting display panel applied to the embodiment will be simply abbreviated as the target panel PN unless specifically described otherwise. However, the embodiment is not limited to the organic light emitting display panel, and other target panels PNs listed above or known in the technical field may be applied within the scope of the teachings herein.

The panel window coupling member PWA may serve to couple a window (see W in FIG. 10) to be described later and the target panel PN. The panel window coupling member PWA may include an optically transparent coupling member. In an embodiment, for example, the panel window coupling member PWA may include an optically transparent adhesive (OCA) or an optically transparent resin (OCR).

Figure 7:
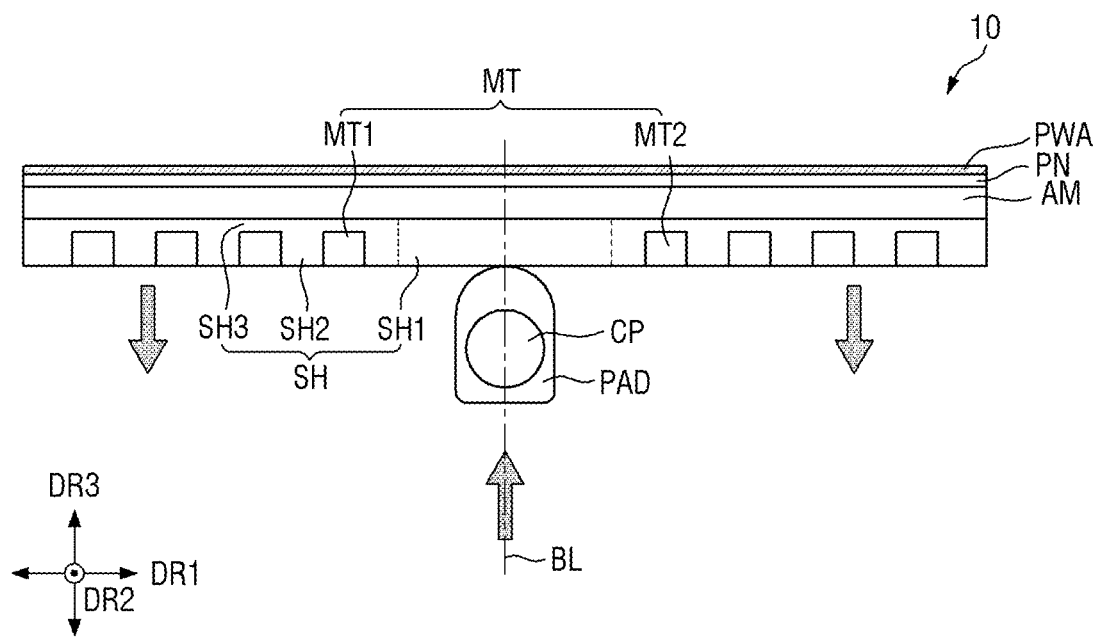

Then, referring to FIG. 7, the sheet portion SH and the panel attachment member AM are folded based on the bending line BL.

The sheet portion SH and the panel attachment member AM may be bent or folded based on the pad PAD disposed to overlap the bending line BL.

In an embodiment, for a folding operation, the pad PAD may be raised in an upper direction (upper direction in the third direction DR3), and the sheet portion SH and the panel attachment member AM may be lowered based on the pad PAD. In FIG. 7, it is illustrated that for the folding operation, the pad PAD is raised in the upper direction (upper direction in the third direction DR3), and the remaining sheet portion SH and panel attachment member AM except for the sheet portion SH and the panel attachment member AM disposed to overlap the pad PAD are lowered based on the pad PAD, but the present disclosure is not limited thereto. For the folding operation, in a state in which only the pad PAD is raised in the upper direction (upper direction in the third direction DR3), and the sheet portion SH and the remaining panel attachment members AM except for the sheet portion SH and the panel attachment member AM disposed to overlap the pad PAD are fixed, the apparatus 10 for manufacturing a display device may be folded. In some embodiments, for the folding operation, in the state in which the pad PAD is fixed, the remaining panel attachment members AM except for the sheet portion SH and the panel attachment member AM disposed to overlap the pad PAD may also be lowered.

Figure 8:
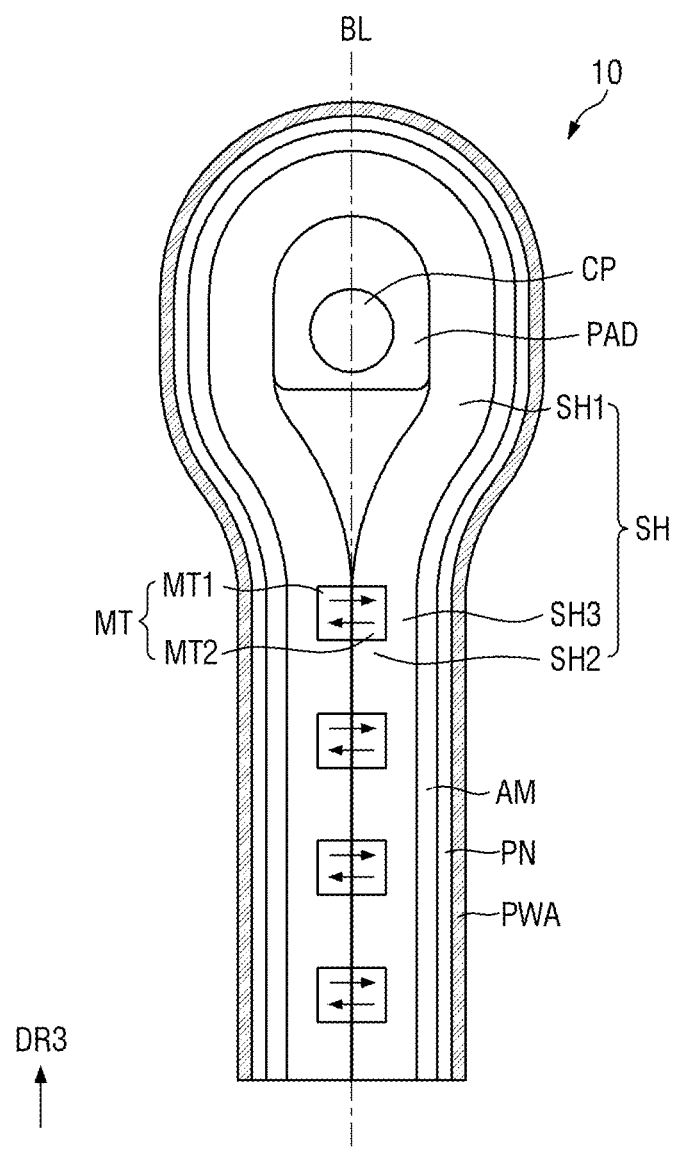

Through the operation described above in FIG. 7, the panel window coupling apparatus 10, the target panel PN, and the panel window coupling member PWA may be folded as illustrated in FIG. 8.

In an embodiment, the first sheet portion SH1, an area of the panel attachment member AM disposed to overlap the first sheet portion SH1 in FIG. 7, and an area of the target panel PN and an area of the panel window coupling member PWA disposed to overlap the first sheet portion SH1 in FIG. 7 may be curved as illustrated in FIG. 8 to form a curved shape, and the second sheet portion SH2, the third sheet portion SH3, the remaining area of the target panel PN, and the remaining area of the panel window coupling member PWA may be flattened to form a flat shape. An area of the panel attachment member AM disposed to overlap the second sheet portion SH2 and the third sheet portion SH3 in FIG. 8 may also be flattened to form a flat shape.

The second sheet portion SH2 having a flat shape positioned on the other side in the first direction DR1 based on the bending line BL illustrated in FIG. 8 may be in direct contact with the second sheet portion SH2 having a flat shape positioned on one side in the first direction DR1.

In such an embodiment, the first magnet portion MT1 on the third sheet portion SH3 having a flat shape positioned on the other side in the first direction DR1 based on the bending line BL illustrated in FIG. 8 may be coupled to the second magnet portion MT2 on the third sheet portion SH3 having a flat shape positioned on one side in the first direction DR1 through a magnetic force.

Figure 9:
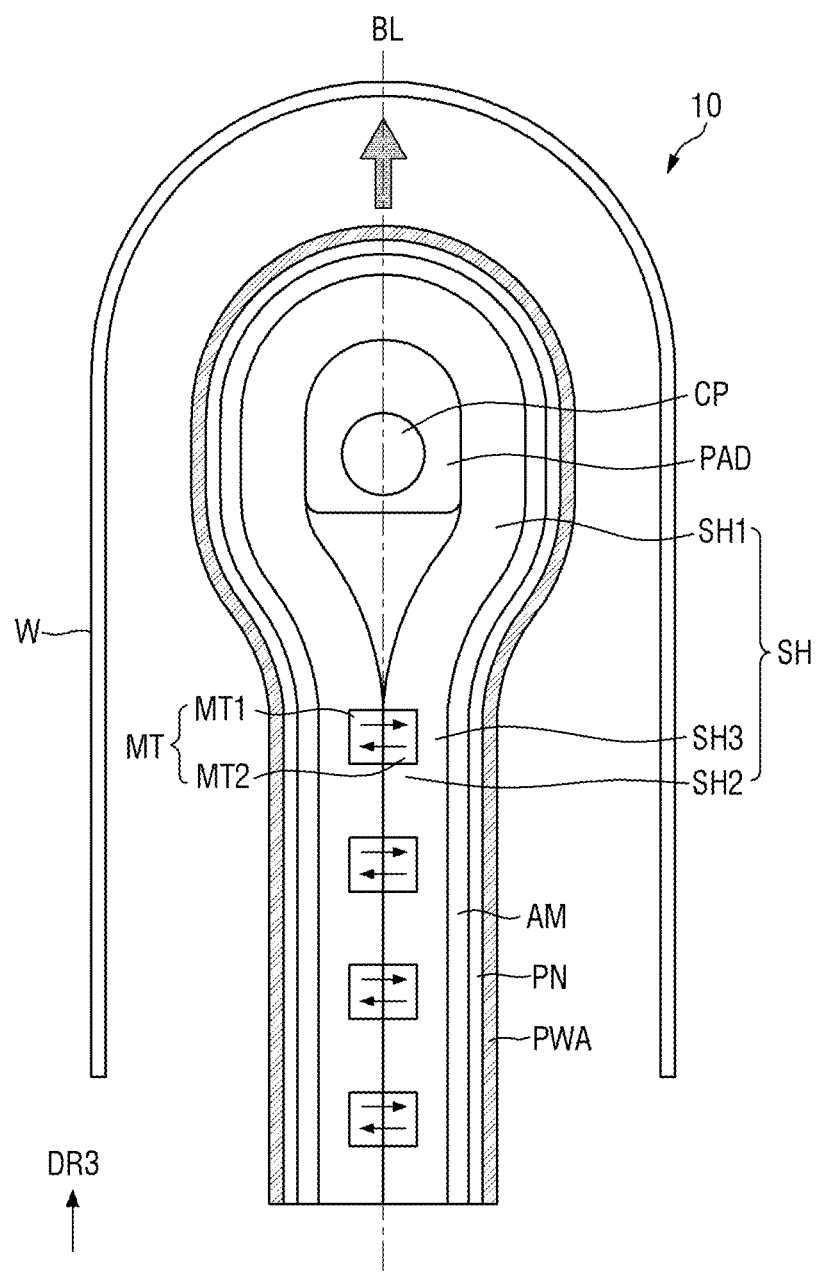
Figure 10:
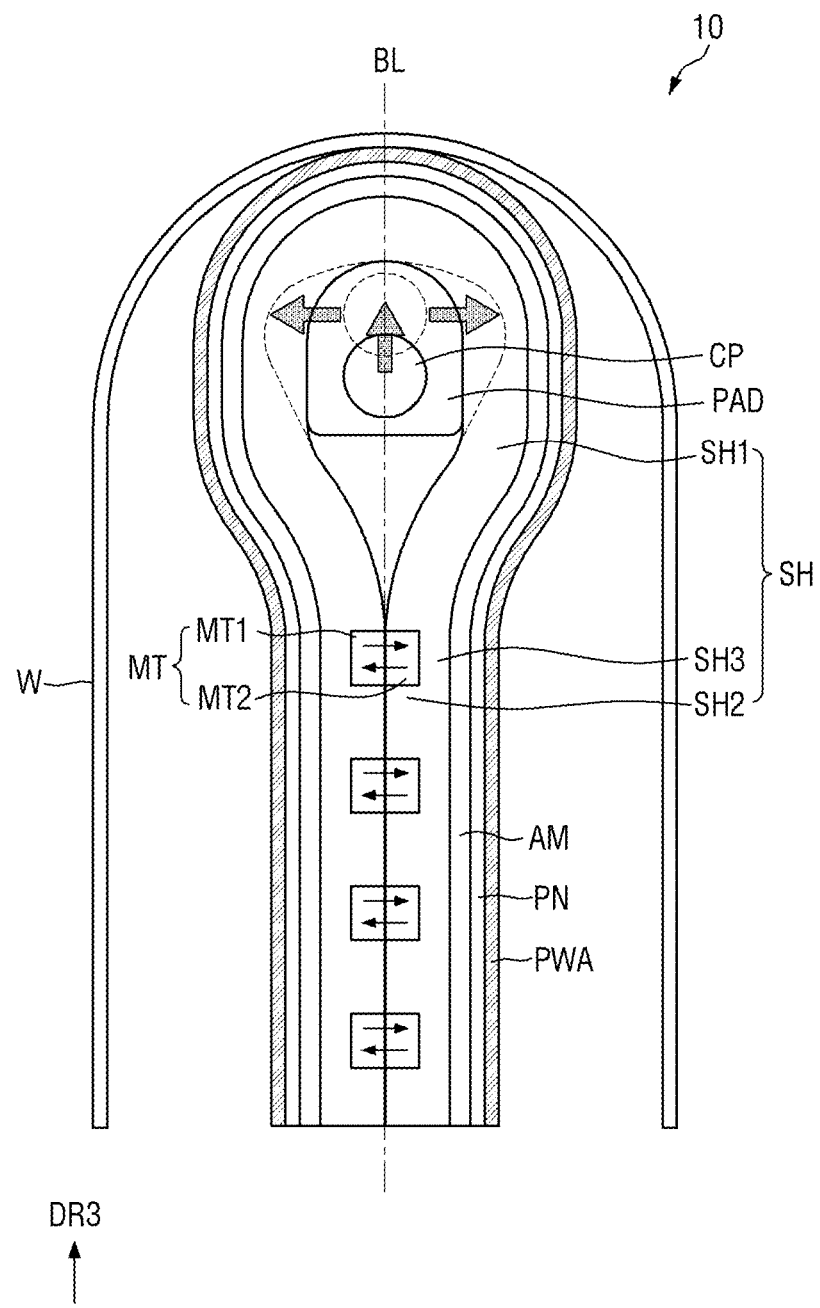

Then, as illustrated in FIGS. 9 and 10, the panel window coupling apparatus 10 is moved or raised to bring a peak of the target panel PN into contact with a peak of the window W.

According to the method for manufacturing the display device according to an embodiment, as the first magnet portion MT1 on the third sheet portion SH3 having a flat shape positioned on the other side in the first direction DR1 based on the bending line BL is coupled to the second magnet portion MT2 on the third sheet portion SH3 having a flat shape positioned on one side in the first direction DR1 through a magnetic force, it is possible to prevent a flat portion of the target panel PN and a flat portion of the window W from being attached to each other by the panel window coupling member PWA in advance before an attachment process between the target panel PN and the window W, that is, the panel window coupling apparatus 10 is raised to bring the peak of the target panel PN into contact with the peak of the window W.

In an embodiment, as illustrated in FIG. 10, the panel window coupling apparatus 10 is raised to bring the peak of the target panel PN into contact with the peak of the window W.

Then, the core CP is raised within the pad PAD and an upper end of the pad PAD is laterally expanded to couple a curved portion of the target panel PN and a curved portion of the window W.

Figure 11:
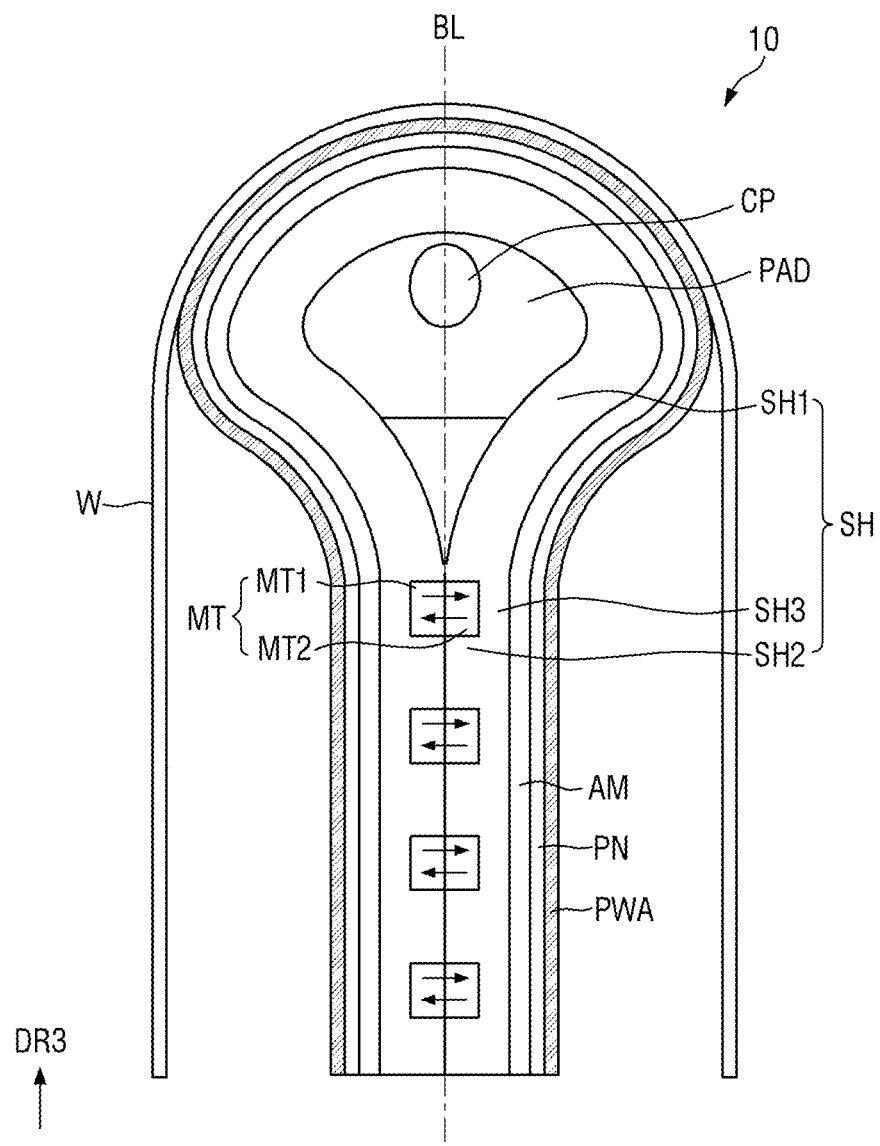

Since a hardness of the core CP is greater than that of the pad PAD, the upper end of the pad PAD may be laterally expanded as illustrated in FIG. 10 when the core CP is raised in the pad PAD. Accordingly, the curved portion of the target panel PN and the curved portion of the window W may be easily coupled to each other (a coupled state is illustrated in FIG. 11).

Figure 12:
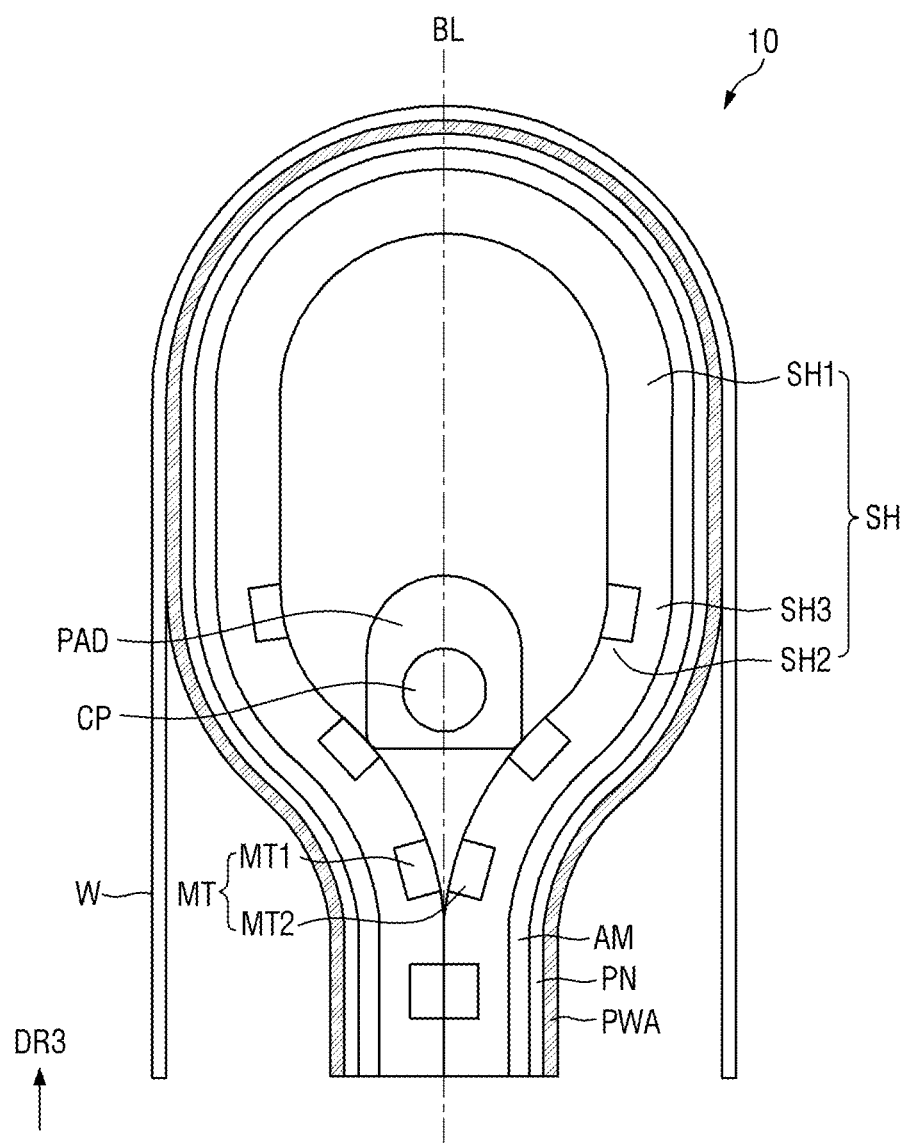
Figure 13:
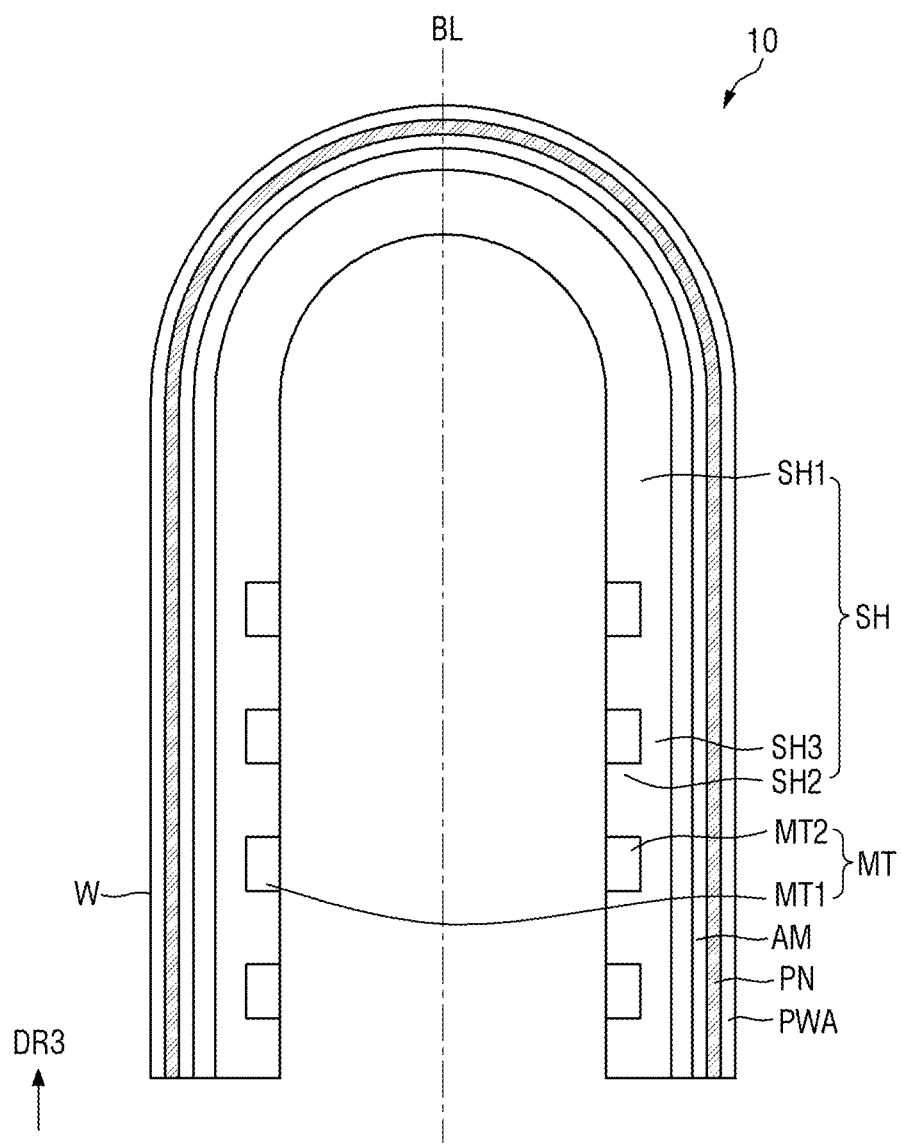

Then, referring to FIG. 12, while the pad PAD is lowered, the first magnet portion MT1 and the second magnet portion MT2 coupled to each other are separated from each other, and the flat portion of the target panel PN and the flat portion of the window W are coupled. FIG. 13 illustrates a state in which the pad PAD and the core CP are removed.

Figure 14:
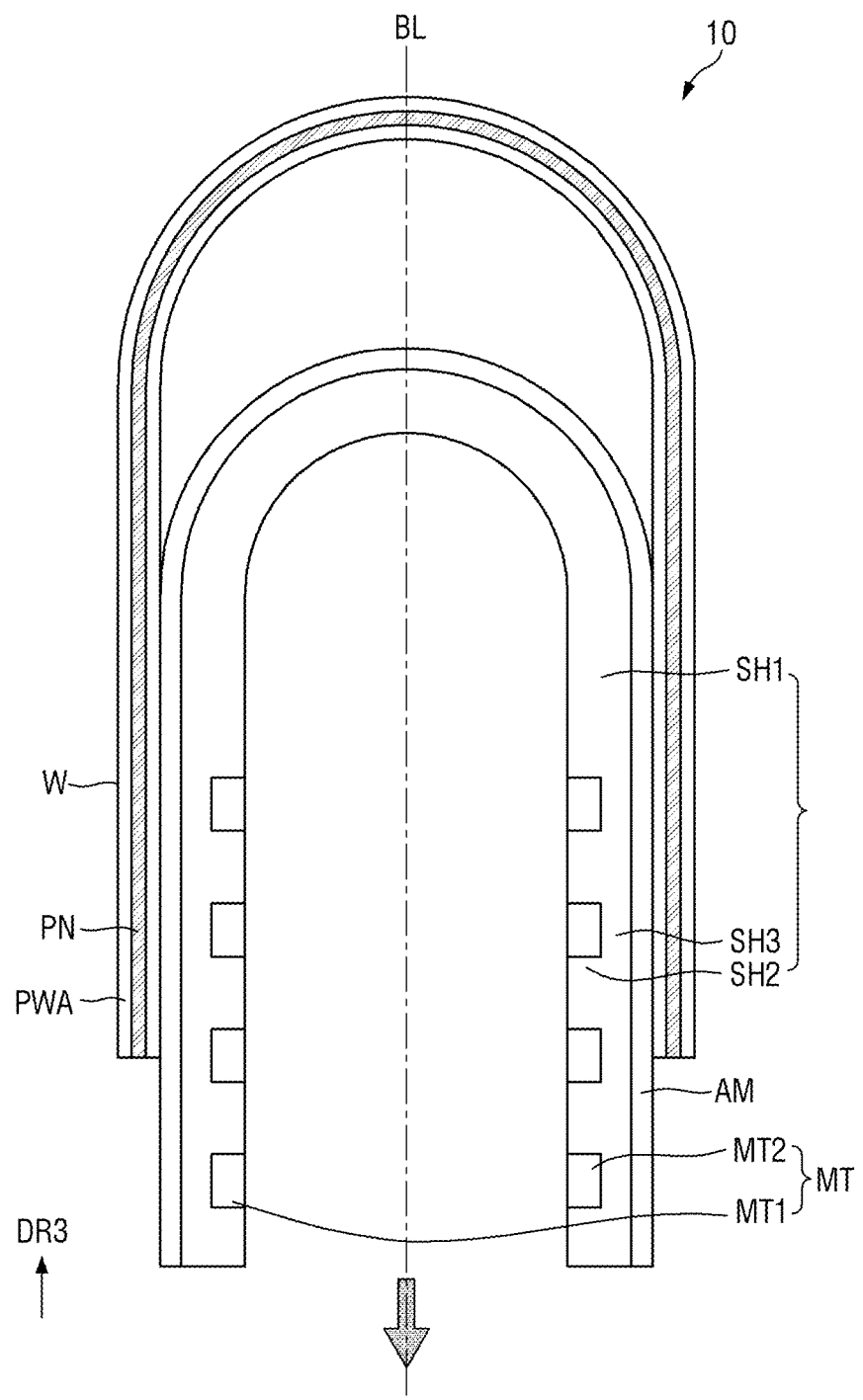

Then, referring to FIG. 14, the panel window coupling apparatus is removed or detached from the target panel PN and the window W coupled to each other.

After removing or detaching the panel window coupling apparatus from the target panel PN and the window W coupled to each other, the panel window coupling apparatus may be reused. Conventionally, the target panel PN and the panel window coupling apparatus 10 are generally coupled to each other through an adhesive and the like. In this case, after the attachment process between the target panel PN and the window W is completed, it may be difficult to reuse the panel window coupling apparatus. However, since the panel window coupling apparatus according to an embodiment attaches the target panel PN using the panel attachment member AM including the electrostatic chuck, the panel window coupling apparatus may be reused again after the panel window coupling apparatus is used for the attachment process between the target panel PN and the window W.

Hereinafter, an apparatus for manufacturing a display device according to an alternative embodiment will be described. In the following embodiments, the same or like components as those described above are denoted by the same or like reference numerals, and any repetitive detailed descriptions thereof will be omitted or simplified.

Figure 15:
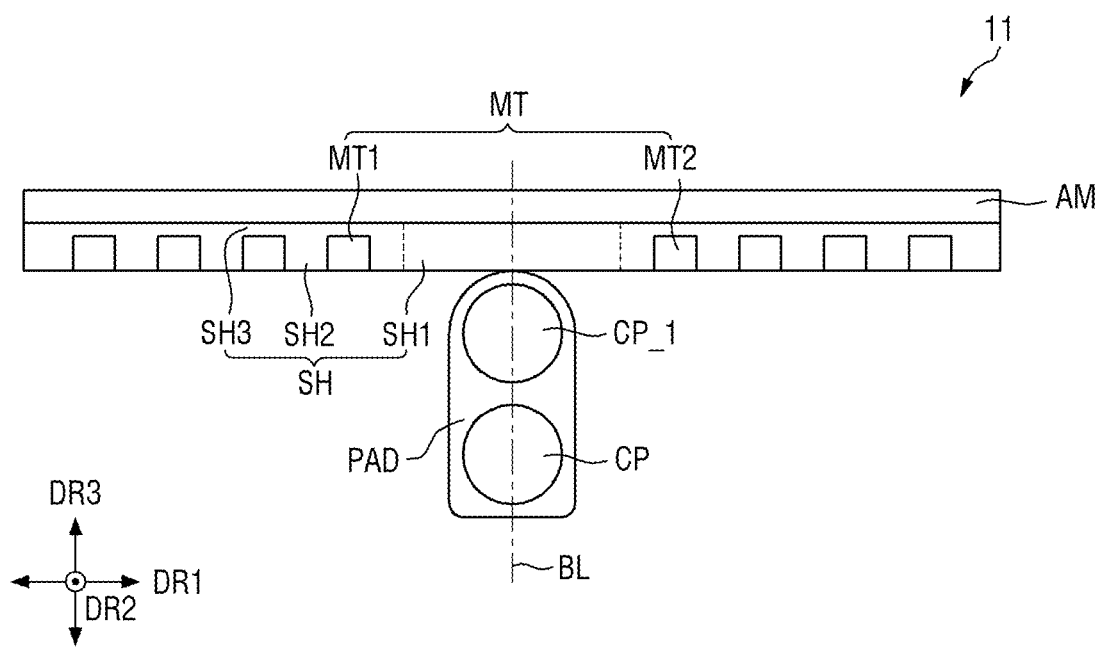
FIG. 15 is a cross-sectional view of an apparatus for manufacturing a display device according to an alternative embodiment.

FIG. 15 is a cross-sectional view of an apparatus for manufacturing a display device according to an alternative embodiment.

The apparatus 11 for manufacturing the display device shown in FIG. 15 is substantially the same as the apparatus 10 for manufacturing the display device shown in FIG. 3 except that a plurality of cores CP and CP_1 may be disposed in one pad PAD. The cross-sectional shapes of the cores CP and CP_1 may be the same as each other, but are not limited thereto. In such an embodiment, where the cross-sectional shapes of the cores CP and CP_1 are the same as each other, diameters (or sizes) of the cores CP and CP_1 may be the same as each other.

Since other features are the same as those described above reference to FIGS. 1 to 5, any repetitive detailed descriptions thereof will be omitted.

Figure 16:
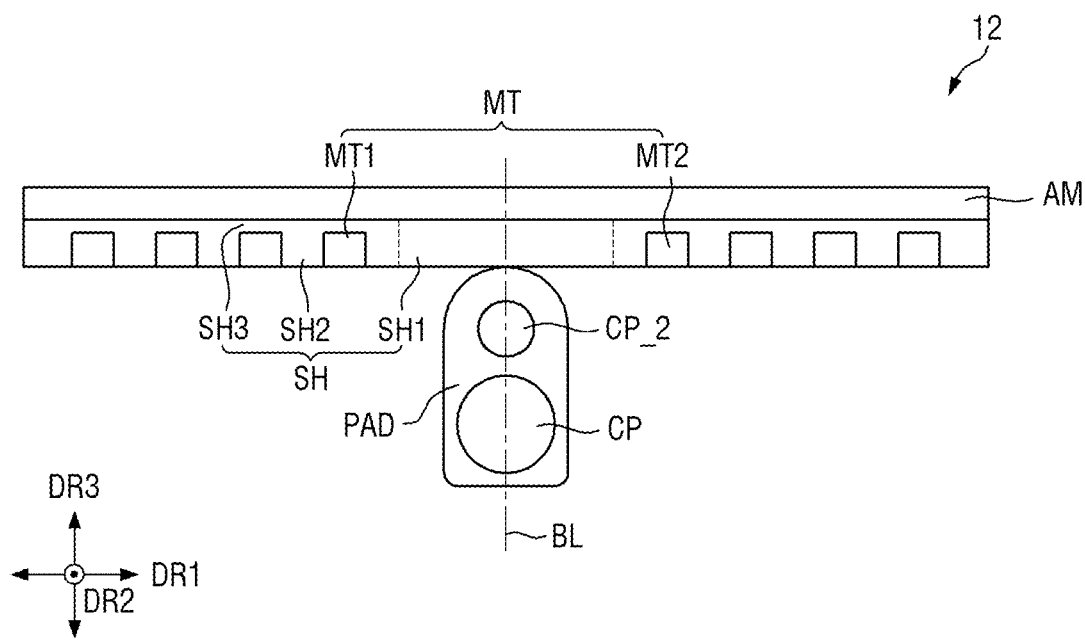
FIG. 16 is a cross-sectional view of an apparatus for manufacturing a display device according to another alternative embodiment.

FIG. 16 is a cross-sectional view of an apparatus for manufacturing a display device according to another alternative embodiment.

The apparatus 12 for manufacturing the display device shown in FIG. 16 is substantially the same as the apparatus 10 for manufacturing the display device shown in FIG. 3 except that a plurality of cores CP and CP_2 may be disposed in one pad PAD. In such an embodiment, the cross-sectional shapes of the cores CP and CP_2 may be the same as each other, but are not limited thereto. In such an embodiment, where the cross-sectional shapes of the cores CP and CP_2 are the same as each other, diameters (or sizes) of the cores CP and CP_2 may be different from each other.

In an embodiment, for example, the diameter (or size) of the core CP_2 positioned at an upper end may be smaller than the diameter (or size) of the core CP positioned at a lower end.

Since other features are the same as those described above reference to FIGS. 1 to 5, any repetitive detailed descriptions thereof will be omitted.

The invention should not be construed as being limited to the embodiments set forth herein. Rather, these embodiments are provided so that this disclosure will be thorough and complete and will fully convey the concept of the invention to those skilled in the art. While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An apparatus for manufacturing a display device, the apparatus comprising:
  a sheet portion, wherein a bending line extending in a first direction is defined to overlap a portion of the sheet portion;
  a panel attachment member disposed on the sheet portion;
  a magnet portion disposed on the sheet portion and including a first magnet portion positioned on a first side in a second direction intersecting the first direction and a second magnet portion positioned on a second side in the second direction with respect to the bending line;
  a pad spaced apart from the panel attachment member with the sheet portion interposed therebetween and positioned between the first magnet portion and the second magnet portion; and
  a core disposed in the pad,
  wherein a hardness of the core is greater than a hardness of the pad, and
  wherein the first magnet portion and the second magnet portion are symmetrical to each other with respect to the bending line.

2. The apparatus of claim 1, wherein each of the first magnet portion and the second magnet portion is spaced apart from the panel attachment member with the sheet portion interposed therebetween.

3. The apparatus of claim 2, wherein in a folding operation state, the sheet portion and the panel attachment member are capable of being folded based on the bending line.

4. The apparatus of claim 3, wherein in the folding operation state, the first magnet portion and the second magnet portion are capable of being coupled to each other.

5. The apparatus of claim 4, wherein the panel attachment member includes an electrostatic chuck.

6. The apparatus of claim 3, wherein in the folding operation state, the sheet portion and the panel attachment member are capable of being folded through the pad.

7. The apparatus of claim 6, wherein the sheet portion and the panel attachment member are capable of being folded by moving the pad toward the portion of the sheet portion overlapping the bending line.

8. The apparatus of claim 2, wherein each of the first magnet portion and the second magnet portion is disposed on a recessed portion of the sheet portion which is recessed in a thickness direction of the sheet portion.

9. The apparatus of claim 1, wherein each of the core and the pad extends in a third direction intersecting the first direction and the second direction.

10. The apparatus of claim 1, wherein the core is provided in plural.

11. The apparatus of claim 10, wherein a plurality of cores have different sizes from each other.

12. A method for manufacturing a display device, the method comprising:
  disposing a target panel and a panel window coupling member on a panel window coupling apparatus, wherein the panel window coupling apparatus includes a sheet portion, wherein a bending line extending along a first direction is defined to overlap a portion of the sheet portion, a panel attachment member disposed on the sheet portion, a magnet portion disposed on the sheet portion and including a first magnet portion positioned on a first side in a second direction intersecting the first direction and a second magnet portion positioned on a second side in the second direction based on the bending line, a pad spaced apart from the panel attachment member with the sheet portion interposed therebetween and positioned between the first magnet portion and the second magnet portion, and a core disposed in the pad, wherein a hardness of the core is greater than a hardness of the pad;
  folding the sheet portion and the panel attachment member based on the bending line; and
  moving the panel window coupling apparatus to bring a peak of the target panel into contact with a peak of a window.

13. The method of claim 12, wherein in the disposing the target panel and the panel window coupling member, each of the first magnet portion and the second magnet portion is spaced apart from the panel attachment member with the sheet portion interposed therebetween, and in the folding the sheet portion and the panel attachment member based on the bending line, the first magnet portion and the second magnet portion are coupled to each other.

14. The method of claim 13, wherein the panel attachment member includes an electrostatic chuck, and wherein the target panel is attached to the electrostatic chuck.

15. The method of claim 14, wherein in the folding the sheet portion and the panel attachment member based on the bending line, the sheet portion and the panel attachment member are folded by moving the pad toward the portion of the sheet portion overlapping the bending line.

16. The method of claim 15, further comprising, after the moving the panel window coupling apparatus to bring the peak of the target panel into contact with the peak of the window, moving the core in the pad to laterally expand an upper end of the pad to couple a curved portion of the target panel and a curved portion of the window to each other.

17. The method of claim 16, wherein after the curved portion of the target panel and the curved portion of the window are coupled to each other, the first magnet portion and the second magnet portion coupled to each other are separated from each other by moving the pad to be away from the portion of the sheet portion overlapping the bending line, and a flat portion of the target panel and a flat portion of the window are coupled to each other.

18. The method of claim 17, wherein the core is provided in plural, and a plurality of cores have different sizes from each other.

* * * * *